US007336201B2

(12) United States Patent
Green et al.

(10) Patent No.: US 7,336,201 B2
(45) Date of Patent: Feb. 26, 2008

(54) REMOTE ACCESS ENERGY METER SYSTEM AND METHOD

(76) Inventors: Ezra Green, 757 Harrison St., West Hempstead, NY (US) 11552; Robert Dockweiler, 1186 Flower La., Wantagh, NY (US) 11793-2717; William O'Connor, 3656 Farm Ranch Rd. S., Bethpage, NY (US) 11714

( * ) Notice: Subject to any disclaimer, the term of this patent is extended or adjusted under 35 U.S.C. 154(b) by 179 days.

(21) Appl. No.: 11/177,035

(22) Filed: Jul. 8, 2005

(65) Prior Publication Data
US 2006/0028354 A1 Feb. 9, 2006

Related U.S. Application Data

(60) Provisional application No. 60/586,993, filed on Jul. 9, 2004.

(51) Int. Cl.
*G08B 23/00* (2006.01)
(52) U.S. Cl. .............. 340/870.02; 340/870.2; 340/870.28; 700/22; 700/286
(58) Field of Classification Search ........... 340/870.02, 340/870.28, 870.2; 375/222; 700/286
See application file for complete search history.

(56) References Cited

U.S. PATENT DOCUMENTS

| 3,697,953 | A | 10/1972 | Schoenwitz | |
|---|---|---|---|---|
| 4,155,252 | A | 5/1979 | Morrill | |
| 4,400,783 | A | 8/1983 | Locke, Jr. et al. | 364/483 |
| 4,783,748 | A | 11/1988 | Swarztrauber et al. | 364/483 |
| RE35,793 | E | 5/1998 | Halpern | |
| 6,556,956 | B1 | 4/2003 | Hunt | 702/188 |
| 6,650,249 | B2 | 11/2003 | Meyer et al. | 340/870.28 |
| 6,671,633 | B2 | 12/2003 | Kramb et al. | 702/34 |
| 6,671,635 | B1 | 12/2003 | Forth et al. | 702/61 |
| 6,714,000 | B2 | 3/2004 | Staats | 324/126 |
| 6,718,271 | B1 | 4/2004 | Tobin | 702/58 |
| 6,766,279 | B2 | 7/2004 | Linley et al. | 702/188 |
| 6,768,970 | B2 | 7/2004 | Shimizu et al. | 702/188 |
| 6,788,214 | B2 | 9/2004 | Lelecas | 340/654 |
| 6,845,336 | B2 | 1/2005 | Kodukula et al. | 702/118 |
| 6,892,165 | B2 | 5/2005 | Yagi et al. | 702/183 |
| 6,898,557 | B2 | 5/2005 | Wegener | 702/188 |
| 6,940,421 | B2 | 9/2005 | Chamberlain et al. | 340/870.02 |
| 6,954,701 | B2 | 10/2005 | Wolfe | 702/22 |
| 6,954,720 | B2 | 10/2005 | Oya | 702/188 |
| 2002/0095269 | A1 | 7/2002 | Natalani et al. | 702/188 |
| 2003/0225551 | A1 | 12/2003 | Hoerner et al. | 702/188 |
| 2004/0030533 | A1 | 2/2004 | Hirose et al. | 702/188 |
| 2004/0073405 | A1 | 4/2004 | Karasawa | 702/188 |
| 2004/0117159 | A1 | 6/2004 | Shimizu | 702/188 |

OTHER PUBLICATIONS

International Search Report and Written Opinion dated Dec. 11, 2006 based on PCT application No. PCT/US05/24382.

*Primary Examiner*—Jeffery Hofsass
*Assistant Examiner*—Sisay Yacob
(74) *Attorney, Agent, or Firm*—Ohlandt, Greeley, Ruggiero & Perle, L.L.P.

(57) ABSTRACT

A remote energy meter system and method is provided having a meter server and a client module located remotely from the meter server. The meter server communicates with the client via a wireless communications link to recover energy production parameter values. The remote energy meter system preferably provides real-time and automated monitoring of, at least, energy production and system failure parameters.

18 Claims, 1 Drawing Sheet

REMOTE ACCESS ENERGY METER SYSTEM AND METHOD

CROSS-REFERENCE TO RELATED APPLICATIONS

This application is related to and claims priority in now abandoned U.S. patent application No. 60/586,993 filed on Jul. 9, 2004, the disclosure of which is incorporated by reference herein.

BACKGROUND OF THE INVENTION

1. Field of the Invention

The present invention relates to an energy monitoring system. More particularly, the present invention relates to a remote access energy monitoring system that remotely monitors energy production of an energy generating source.

2. Description of the Related Art

Energy generation systems are complex and costly to establish, operate, and maintain. A key component in the maintenance and operation of energy generation facilities is the accurate monitoring of the system's performance and health status. Accordingly, it is important to accurately and timely monitor and analyze key parameters of the energy generation facility's operating parameters. Such monitoring becomes increasingly vital in remotely located energy generation facilities.

Thus, there exists a need to provide an efficient and reliable system and method of remotely accessing and monitoring energy generation installations.

SUMMARY OF THE INVENTION

It is an object of the present invention to provide a remote access energy meter system that provides remote monitoring of an energy generation facility.

It is another object of the present invention to provide such a remote access energy meter system that provides real-time monitoring of the energy generation facility.

It is still another object of the present invention to provide such a remote access energy meter system that can automatically monitor a number of energy production parameters of the energy generation facility.

It is yet another object of the present invention to provide such a remote access energy meter system that facilitates detection of energy production parameters indicative of system failure and/or system degradation.

These and other objects and advantages of the present invention are achieved by a remote energy meter system having a meter system server and a client module located remotely from the metering system server. The meter system server communicates with the client to recover energy production parameter values. The remote energy meter system preferably provides real-time and automated monitoring of, at least, energy production and system failure parameters.

DETAILED DESCRIPTION OF THE INVENTION

Figure 1:
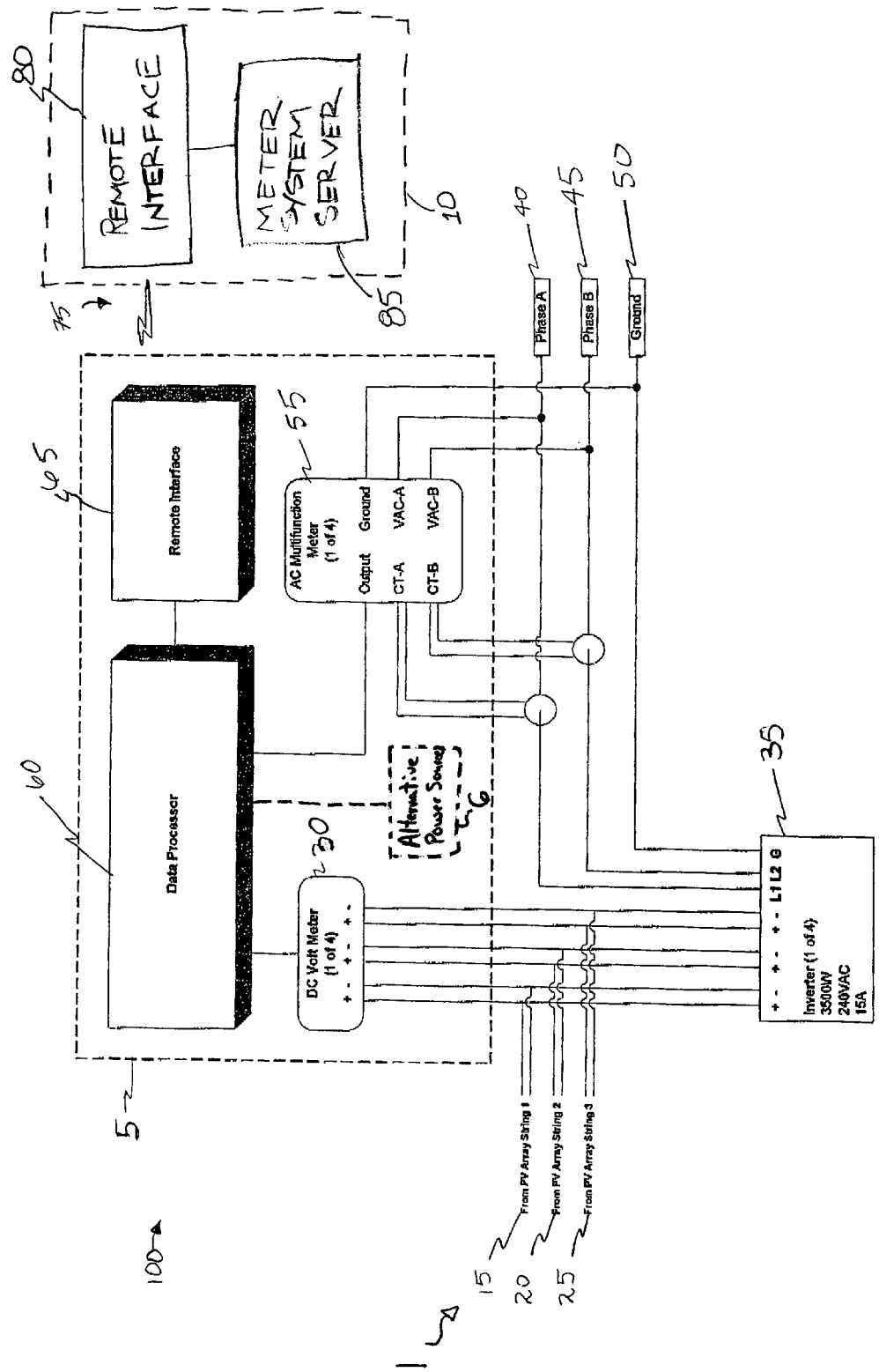
FIG. 1 is an exemplary schematic diagram of the remote access energy meter system of the present invention.

Referring to FIG. 1, there is shown a remote access energy meter system generally represented by reference numeral 100. Remote access energy meter system 100 is also referred to herein as meter system.

Meter system 100 includes, in general, a client module 5 and a meter server 10. Client module 5 interfaces with and monitors a source of energy, such as an energy generation or production facility or installation. Various parameters related to the production of energy by the energy generation facility can be monitored by client module 5.

The energy source may vary. In one aspect of the present invention, the energy source is an alternative energy source. The alternative energy sources can include solar, wind, geo-thermal, tidal, and other types of non-fossil fuel dependent energy generation facilities. It should be appreciated however that the particular type of energy source monitored by meter system 100 can vary. The energy source may be a conventional fossil fuel driven energy installation.

Notwithstanding the particular energy source being monitored by meter system 100, data received by client 5 can be communicated to meter server 10 that is located remotely, some distance apart from client module 5. While alternative energy facilities may be located in sparsely populated areas or even dispersed over geographically large areas, any energy source can be monitored by remote meter system 100.

Client module 5 is preferably powered from the energy generation facility's standard AC service. Client module 5 may be non-functional during blackout and severe brownout conditions. If a power failure exceeds a predetermined period of time, for example two hours, then meter system 100 preferably automatically reports the failure to meter sever 10 upon resumption of net power. In certain embodiments hereof, an uninterruptible power source or alternative power source 6, preferably including a backup power management system, can be used to provide an alternative or secondary power source for client module 5.

Client module 5 preferably provides real-time monitoring of operating parameters in order to detect, for example, system production, status, and failures. Referring to FIG. 1, client 5 is shown monitoring a solar energy facility 1. A number of photovoltaic (PV) arrays 15, 20, 25 are provided to directly convert solar energy (e.g., sunlight) into electricity. PV arrays 15, 20, and 25 generate DC electricity. AC current is monitored using, for example, external toroidal sensor coils (not shown). Energy totals are preferably registered and stored in a non-volatile memory in case of power failure. DC voltmeter 30 monitors the output voltage of the individual PV array strings 15, 20, 25. Data processor 60 monitors the AC and DC inputs to the client module 5 in order to detect system failure and status. Client module 5 preferably detects and reports, at least, PV array string failures and power inverter failures to sever 10.

The DC electricity is converted to AC electricity by one of a number of inverters 35. DC electricity is an input to inverter 35 and AC electricity is an output of inverter 35. AC meter 55 accepts current and voltage data from the AC output of each inverter 35.

The output of inverter 35 includes a phase A 40, phase B 45, and a ground potential 50. The output of the inverter is monitored by an AC meter 55. AC meter 55 accepts current and voltage data from the AC output of each inverter 35. AC meter 55 preferably measures various parameters of AC electricity output by inverter 35. For example, AC meter 55 measures the currents and voltages of the AC electricity output by inverter 35. It should be appreciated that additional characteristic parameters of the AC energy can be monitored and measured by AC meter 55.

Client module 5 further includes a data processor 50 for processing the data measured by DC voltmeter 30 and AC multifunction meter 55. The processes can include formatting, reading, storing, and determining various relationships between the measured parameters and/or relative to desired or preset values for the parameters.

Remote interface 65 provides access to client module 5 from the server for monitoring energy produced. Remote interface 65 can be used by client module 5 to report system failure to meter server 10. Remote interface 65 provides a communication gateway for communicating data processed by data processor 60 to remotely located meter server 10. Remote interface 65 may perform numerous functions, including converting data from data processor 60 into a format suitable for transmitting to server 10. The output of remote interface 65 is preferably in a condition for transmission over communication link 75 without the need of further signal conditioning by communications link 75.

In some embodiments hereof, communication link 75 is preferably a wireless communication system such as a cellular link, microwave link, a satellite communication link and any combinations including these and other wireless communication links. It should be appreciated that at least a portion of communication link 75 may not be wireless since, for example, cellular and satellite communication links may interface with terrestrial communication systems such as a PSTN that includes non-wireless communication links.

Meter server 10 is an automated data retrieval system. Meter server 10 includes, generally, a remote interface 80 that provides a communication gateway for communicating data received over communications link 75. Remote interface 80 may perform numerous functions, including converting data from communications link 75 into a format suitable for being received and processed by meter system server 85. Meter system server 85 preferably maintains a database of meter system 100 client data. The processing can be done via a microprocessor.

In an embodiment hereof, a primary client identification is the remote energy generation facility's access number. For an installation using a dedicated telephone line or cellular modem, the primary client identification can be the eleven digit phone number. For installations using LAN or WiFi, the primary client identification can be a twelve digit fixed system IP address. Meter server 10 can regularly and automatically access the remote client module(s) 5 to recover and record current energy totals. Current energy totals can be compared to previously retrieved data to calculate energy production.

Client access can be configured to occur daily, weekly, monthly or any other customized time period. Automated remote access can be scheduled to occur, for example, between 11:00 AM and 1:00 PM at the remote site. Remote client module(s) 5 can be non-functional during blackout and severe brownout conditions. In the instance meter server 10 fails to connect to a client module 5 then site access is rescheduled, as an example, for the following day. In the event a second no connect condition occurs then an error report is transmitted (e.g., by email) a system administrator of meter system 100. In the instance subsequent contact is successful then meter system 100 assumes a utility power failure or brownout and logs the event.

Sites suspected or known to have frequent power failures can be flagged for more frequent contact. If the problem persists the site history logs can be used to document the utility failures to the power authority responsible for the client's site.

While the instant disclosure has been described with reference to one or more exemplary embodiments, it will be understood by those skilled in the art that various changes may be made and equivalents may be substituted for elements thereof without departing from the scope thereof. In addition, many modifications may be made to adapt a particular situation or material to the teachings of the disclosure without departing from the scope thereof. Therefore, it is intended that the disclosure not be limited to the particular embodiment(s) disclosed as the best mode contemplated for carrying out this invention, but that the invention will include all embodiments falling within the scope of the appended claims.

What is claimed is:

1. A remote energy meter system for monitoring an energy generation facility comprising:
   a client module operably connected to the energy generation facility for collecting data representative of energy production parameters of the energy generation facility;
   an energy production source that generates an input;
   an inverter that converts the input generated by the energy production source into an output;
   a meter that measures data of the output converted by the inverter;
   a data processor that processes the data measured by the meter;
   a server located remotely from the client module, wherein the server communicates with the client module to recover the energy production parameters; and
   a remote interface that provides access to the client module from the server for monitoring the energy production parameters.

2. The remote energy meter system of claim 1, wherein the server receives real-time energy production parameters.

3. The remote energy meter system of claim 1, wherein the energy production parameters comprise system failure parameters.

4. The remote energy meter system of claim 1, wherein the server communicates with the client module via a wireless communications link.

5. The remote energy meter system of claim 1, wherein the server communicates with the client module via a communications link comprising a cellular link.

6. The remote energy meter system of claim 1, wherein the server communicates with the client module via a communications link comprising a microwave link.

7. The remote energy meter system of claim 1, wherein the server communicates with the client module via a communications link comprising a satellite link.

8. The remote energy meter system of claim 1, wherein the client module further comprises a secondary power source.

9. An energy generation facility comprising:
   a pluralitv of photovoltaic arrays that directly convert solar energy into DC electricity having a current and a voltage;
   a client module operably connected to the plurality of photovoltaic arrays for collecting data representative of energy production parameters of the plurality of photovoltaic arrays;
   an inverter that converts the DC electricity to AC electricity having a current and a voltage;
   a plurality of external toroidal sensor coils that monitor the current of the AC electricity;

an AC meter that measures the current and the voltage of the AC electricity;

a data processor that processes the current and the voltage measured by the AC meter; and a server located remotely from the plurality of photovoltaic arrays and client module, wherein the server communicates with the client module to recover the energy production parameters.

10. The energy generation facility of claim 9, wherein the server receives real-time energy production parameters.

11. The energy generation facility of claim 9, wherein the energy production parameters comprise system failure parameters.

12. The energy generation facility of claim 9, wherein the server communicates with the client module via a wireless communications link.

13. The energy generation facility of claim 9, wherein the server communicates with the client module via a communications link comprising a cellular link, a microwave link or a satellite link.

14. The energy generation facility of claim 9, wherein the client module further comprises a secondary power source.

15. A method of monitoring a solar energy facility comprising:

converting solar energy into DC electricity by a plurality of photovoltaic arrays;

collecting data representative of energy production parameters of the solar energy facility;

converting the DC electricity into AC electricity with an inverter, wherein the AC electricity has a current and a voltage;

measuring the current and the voltage of the AC electricity with a meter;

generating signals representative of the data; and communicating the signals to a server located remotely from the solar energy facility.

16. The method of claim 15, wherein the communication of the signals to the server is via a wireless communications link.

17. The method of claim 15, wherein the collection of the data is done periodically.

18. The method of claim 15, further comprising converting the signals into the data and processing the data via a microprocessor.

* * * * *